(12) United States Patent
Stormont (10) Patent No.: US 9,891,299 B1
(45) Date of Patent: Feb. 13, 2018

(54) METHODS AND SYSTEMS FOR CORRECTING B0 FIELD IN MRI IMAGING USING SHIM COILS

(71) Applicant: General Electric Company, Scheneectady, NY (US)

(72) Inventor: Robert Steven Stormont, Hartland, WI (US)

(73) Assignee: General Electric Company, Schenectady, NY (US)

( * ) Notice: Subject to any disclaimer, the term of this patent is extended or adjusted under 35 U.S.C. 154(b) by 743 days.

(21) Appl. No.: 14/281,431

(22) Filed: May 19, 2014

(51) Int. Cl.
- *G01R 33/38* (2006.01)
- *G01R 33/3873* (2006.01)
- *G01R 33/58* (2006.01)
- *G01R 33/385* (2006.01)

(52) U.S. Cl.
CPC ....... *G01R 33/3873* (2013.01); *G01R 33/385* (2013.01); *G01R 33/58* (2013.01)

(58) Field of Classification Search
CPC .............. G01R 33/3873; G01R 33/385; G01R 33/3875; G01R 33/387; G01R 33/58; G01R 33/34; G01R 33/34038–33/34076; G01R 33/345–33/3456
See application file for complete search history.

(56) References Cited

U.S. PATENT DOCUMENTS

| | | | | |
|---|---|---|---|---|
| 4,083,006 A * | 4/1978 | Yokoshima | ............ | G01R 29/00 343/703 |
| 4,621,237 A * | 11/1986 | Timms | ................. | G01R 33/341 324/318 |
| 5,317,266 A * | 5/1994 | Meissner | ............. | G01R 33/341 324/318 |
| 5,777,474 A * | 7/1998 | Srinivasan | ....... | G01R 33/34046 324/318 |
| 6,727,698 B1 * | 4/2004 | Eydelman | ........ | G01R 33/34053 324/318 |
| 6,980,000 B2 * | 12/2005 | Wong | ................ | G01R 33/34053 324/318 |
| 7,855,559 B2 | 12/2010 | DeFranco et al. | | |
| 2002/0079996 A1 * | 6/2002 | Zhang | .................. | G01R 33/345 335/216 |
| 2008/0157762 A1 * | 7/2008 | Weiss | ............... | G01R 33/34046 324/304 |

(Continued)

*Primary Examiner* — Clayton E Laballe
*Assistant Examiner* — Ruifeng Pu
(74) *Attorney, Agent, or Firm* — Dean D. Small; The Small Patent Law Group, LLC (57) ABSTRACT

A magnetic resonance imaging (MRI) system includes a plurality of radio frequency (RF) coils configured to produce a static B0 field having non-homogeneous characteristics. The MRI system includes an RF transceiver configured to acquire MR imaging data from the RF coils for an area of interest. The system includes a DC source coupled to at least one of the RF coils to form a shimming RF coil, the DC source configured to force a select DC current through the shimming RF coil to at least partially shim the non-homogeneous characteristics of the B0 field. The shimming RF coil includes first and second conductors that exhibit distributed capacitance along a length thereof. At least one of the first and second conductors have first and second termination ends with an elongated and continuous conductive path therebetween to convey the select DC current from the DC source through the shimming RF coil.

20 Claims, 7 Drawing Sheets

(56) References Cited

U.S. PATENT DOCUMENTS

| | | | |
|---|---|---|---|
| 2012/0112748 A1* | 5/2012 | Hetherington | G01R 33/34007 324/318 |
| 2014/0002084 A1* | 1/2014 | Han | G01R 33/3628 324/322 |
| 2014/0225613 A1* | 8/2014 | Reykowski | G01R 33/3628 324/309 |
| 2015/0015262 A1* | 1/2015 | Greim | G01R 33/385 324/322 |
| 2015/0323628 A1* | 11/2015 | Wald | G01R 33/341 324/309 |
| 2016/0116556 A1* | 4/2016 | Darnell | G01R 33/3875 324/307 |
| 2016/0139218 A1* | 5/2016 | Possanzini | G01R 33/288 324/321 |

* cited by examiner

METHODS AND SYSTEMS FOR CORRECTING B0 FIELD IN MRI IMAGING USING SHIM COILS

BACKGROUND

The subject matter disclosed herein relates generally to magnetic resonance imaging (MRI) systems, and more particularly to methods and systems for correcting a B0 field in MRI imaging using shim coils.

MRI is a medical imaging modality that generates images of the inside of a human body without using x-rays or other ionizing radiation. MRI or Nuclear Magnetic Resonance (NMR) imaging generally provides for the spatial discrimination of resonant interactions between Radio Frequency (RF) waves and nuclei in a magnetic field. Specifically, MRI utilizes hydrogen nuclear spins of the water molecules in the human body, which are polarized by a strong, static magnetic field of a magnet. This magnetic field is commonly referred to as B0, or the main magnetic field. When a substance, such as human tissue, is subjected to the main magnetic field, the individual magnetic moments of the spins in the tissue attempt to align with the main magnetic field. The magnetic moments that are associated with the spins become preferentially aligned along the direction of the magnetic field, resulting in a small net tissue magnetization along an axis of the magnetic field. When excited by an RF wave, the spins precess about the main magnetic field at resonance frequency of the hydrogen nuclei, commonly referred to as the Larmor frequency.

The MRI system also includes a superconducting magnet that generates the main magnetic field within an imaging volume. The main magnetic field is essentially a large field with small non-homogeneous characteristics in select portions of the field. Manufacturing processes, as well as equipment and site conditions, create the non-homogeneous characteristics in the main magnetic field B0. In operation, the non-homogeneous characteristics in the magnetic field B0 may distort the position information in the imaging volume and degrade the image quality.

The MRI system uses various types of RF coils to create pulses of RF energy at or near the Larmor frequency. The RF coils transmit RF excitation signals and receive magnetic resonance (MR) signals that the MRI system processes to form the images. Traditional RF coils have discrete capacitive elements at select points about a circumference of a loop to tune the RF coil to a select resonance frequency to receive the RF energy.

Inductive elements are located in parallel with each capacitive element to permit correcting current to flow through the RF coil. The inductive elements are large to limit heating during RF signal transmission and reception. The inductive elements are also resistive and lead to electrical losses. Further, the inductive elements limit the amount of corrective current that may be applied. For example, a large direct current in in the inductive element may induce a magnetic field that may interfere with the main magnetic field.

BRIEF DESCRIPTION

In accordance with various embodiments, a magnetic resonance imaging (MRI) system is provided. The MRI system includes a plurality of radio-frequency (RF) coils positioned about a bore of a magnet. The magnet is configured to produce a static B0 field. The B0 field has non-homogeneous characteristics in an area of interest. The MRI system also includes an RF transceiver system configured to transmit RF signals to the RF coils and configured to acquire MR imaging data from the RF coils for an object in the area of interest. The MRI system also includes a direct current (DC) source coupled to at least one of the RF coils to form a shimming RF coil, the DC source configured to force a select DC current through the shimming RF coil to at least partially shim the non-homogeneous characteristics of the B0 field in the area of interest. The shimming RF coil includes first and second conductors that exhibit distributed capacitance (DCAP) along a length thereof. At least one of the first or the second conductors have first and second termination ends with an elongated and continuous conductive path therebetween to convey the select DC current driven from DC source through the shimming RF coil.

In accordance with other embodiments, a method for generating a magnetic resonance (MR) image is provided. The method includes positioning a plurality of radio-frequency (RF) coils about a bore of a magnet. The magnet is configured to produce a static B0 field. The B0 field has non-homogeneous characteristics in an area of interest. The method includes transmitting RF signals to the RF coils using an RF transceiver system. The method includes acquiring MR imaging data from the RF coils for an object in the area of interest using the RF transceiver system. The method includes coupling a direct current (DC) source to at least one of the RF coils to form a shimming RF coil, the DC source configured to force a select DC current through the shimming RF coil to at least partially shim the non-homogeneous characteristics of the B0 field for the area of interest. The shimming RF coil includes first and second conductors that exhibit distributed capacitance (DCAP) along a length thereof. At least one of the first or the second conductors have first and second termination ends with an elongated and continuous conductive path therebetween to convey the select DC current driven from DC source through the shimming RF coil.

DETAILED DESCRIPTION

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry. For example, one or more of the functional blocks (e.g., processors or memories) may be implemented in a single piece of hardware (e.g., a general purpose signal processor or a block of random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

Various embodiments described herein relate generally to instruments for magnetic resonance imaging (MRI) and/or nuclear magnetic resonance (NMR) imaging systems and methods for generating images therefrom. The various embodiments include improvements in radio frequency (RF) coils that simultaneously shim an MR magnet while transmitting or receiving RF signal information. The RF coils include a first conductor and a second conductor that form a distributed capacitor such that the first and second conductors have inductive and capacitive properties that are based on the length of the conductors.

Figure 1:
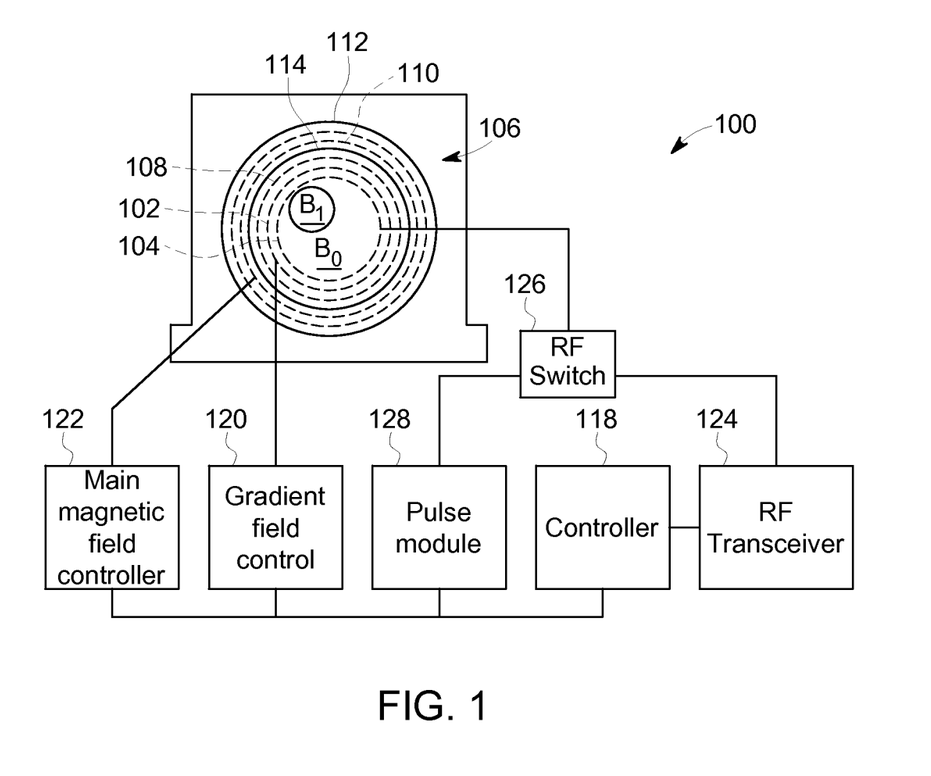
FIG. 1 is a schematic of a magnetic resonance imaging system having RF coils formed in accordance with an embodiment.

FIG. 1 is a schematic illustration of an MRI imaging system 100 having RF coils 102 and 104 formed in accordance with an embodiment. The various components described herein may be embodied in an imaging system, such as the imaging system 700 described in relation to FIG. 7. In various embodiments, the imaging system 100 may include a plurality of RF coils, such as the RF coils 102, 104. The RF coils 102, 104 are configured to simultaneously shim an MRI magnet while transmitting or receiving RF signal information, as is discussed below. At least one of the RF coils 102, 104 have conductors that are elongated and continuous such that the conductors uninterrupted by, and are void of, any discrete or lumped capacitive or inductive elements about an entire length of the conductor.

In the illustrated embodiment, the imaging system 100 is a single modality MRI imaging system. But in other embodiments, the imaging system 100 may be implemented in or with multi-modality imaging systems. For example, the imaging system 100 may be combined with different types of medical imaging systems, such as a computed tomography (CT), positron emission tomography (PET), a single photon emission computed tomography (SPECT), as well as an ultrasound system, or any other system capable of generating images, particularly of a human. Moreover, the various embodiments are not limited to medical imaging of human subjects, but may include veterinary or non-medical systems for imaging non-human objects, such as luggage, etc.

The imaging system 100 includes a magnet assembly 106 that includes a superconducting magnet 108. However, in other embodiments, other types of magnets may be used, such as permanent magnets or electromagnets. The superconducting magnet 108 is formed from a plurality of magnetic coils supported on a magnetic coil support structure (not shown). The magnet assembly 106 includes a thermal shield 110 and an outer vacuum vessel 112. A helium vessel 114 surrounds the superconducting magnet 108, and the thermal shield 110 surrounds the helium vessel 114. The outer vacuum vessel 112 surrounds the thermal shield 110. The thermal shield 110, the outer vacuum vessel 112, and the helium vessel 114 form what is known as a cryostat.

In operation, the helium vessel 114 is filled with liquid helium to cool the coils of the superconducting magnet 108. A body of an object to be imaged, such as a patient, is placed in a bore 116 of the superconducting magnet 108. Specifically, the object of interest is situated within the bore 116. The superconducting magnet 108 produces a static main magnetic field B0 along the bore 116 where the patient is located. A controller 118 controls the strength of the main magnetic field B0 through the bore 116, via a main magnetic field controller 122.

The RF coils 102, 104 may be located about the bore of the magnet. For example, the RF coils 102, 104 may be circumferentially positioned about the bore of the magnet 108. The RF coils 102, 104 may be selectively oriented with respect to the bore of the magnet 108 to capture RF energy. The RF coils 102, 104 may be tuned, or selectively configured, to be receptive at select frequencies. The RF coils 102, 104 transmit RF energy at select frequencies to excite a response from the material of the object being imaged. The RF coils 102, 104 also receive RF energy at select frequencies to generate RF signal information.

The imaging system 100 may include a plurality of RF coils coupled to a transceiver system 124 and an RF switch 126 controlled by a pulse module 128. The pulse module 128 is operably coupled to the controller 118 to synchronize the operation of the pulse module 128, the magnetic field controller 122, and a gradient field controller 120. For example, the pulse module 128 may send instructions, commands, and/or requests describing the timing, strength, and shape of the RF signals, and pulse sequences to be produced. The transceiver system 124 is operably coupled to the RF coils 102, 104 via the RF switch 126. The RF switch 126 governs whether the RF coils 102,104 are to transmit RF energy or receive RF energy to generate RF signals based on the RF energy. The RF signals are digitized by the transceiver system 124 and are processed (e.g., using a fast Fourier transform) to generate images.

The main magnetic field B0 includes non-homogeneous characteristics along the bore including within an area of interest. For example, the main magnetic field B0 may exhibit varying strength or orientation (e.g., convergent or divergent field lines) through a portion of the area of interest. The variation in strength and/or orientation may be the result of imperfections in the superconducting magnet 108, ambient sources of secondary magnetic fields and/or metallic objects that interfere with the main magnetic field B0. For example, secondary magnetic fields created by large inductors that may be present may interfere with main magnetic field B0. The non-homogeneous characteristics may distort position information used by the imaging system 100, reduce image quality, or otherwise degrade performance of the imaging system 100. In accordance with embodiments herein, one or more of the RF coils 102, 104 may be configured to shim, or offset, the non-homogeneous characteristics of main magnetic field B0. When configured as such, the RF coil may be referred to herein as a "shimming RF coil."

The shimming RF coils 102, 104 generate a gradient magnetic field $B_{shim}$ (e.g., an electromagnetic field) when driven by a shim current. The shim current represents a direct current (DC) that is applied through the shimming RF coils 102, 104 such that the shimming RF coils 102, 104 act as an electromagnet to generate the gradient magnetic field $B_{shim}$. The DC current is also referred to herein as a shimming DC current. The shimming RF coils 102, 104 impose the gradient magnetic field $B_{shim}$ on the main magnetic field B0 to compensate for, or negate, the effects of the non-homogeneous characteristics. For example, the gradient magnetic field $B_{shim}$ may increase the effective strength of the main magnetic field B0 in a select region. As another example, the gradient magnetic field $B_{shim}$ may divert or change the orientation of the main magnetic field B0 in a select region. The shimming RF coils 102, 104 may be selectively positioned about the bore of the superconducting magnet 108 such that the gradient magnetic field $B_{shim}$ compensates for the non-homogeneous characteristics. For example, the shimming RF coils 102, 104 may be situated within a volume of the bore such that the gradient magnetic field $B_{shim}$ at least partially extends to and through the area of interest.

Shimming RF coils 102, 104 may use more or fewer turns to vary the strength of the gradient magnetic field $B_{shim}$. Additionally, each of the shimming RF coils 102, 104 may include more or fewer coil turns to vary the strength of the gradient magnetic field $B_{shim}$. The strength of the gradient magnetic field may also be controlled by the amount of shim current that is applied to the shimming RF coils 102, 104. The gradient field controller 120 may control the application of the shim current to the shimming RF coils 102, 104. In this manner, the shimming RF coils 102, 104 substantially reduce or eliminate the non-homogeneous characteristics to produce a uniform main magnetic field B0 that has a substantially constant magnitude throughout the area of interest.

Figure 2:
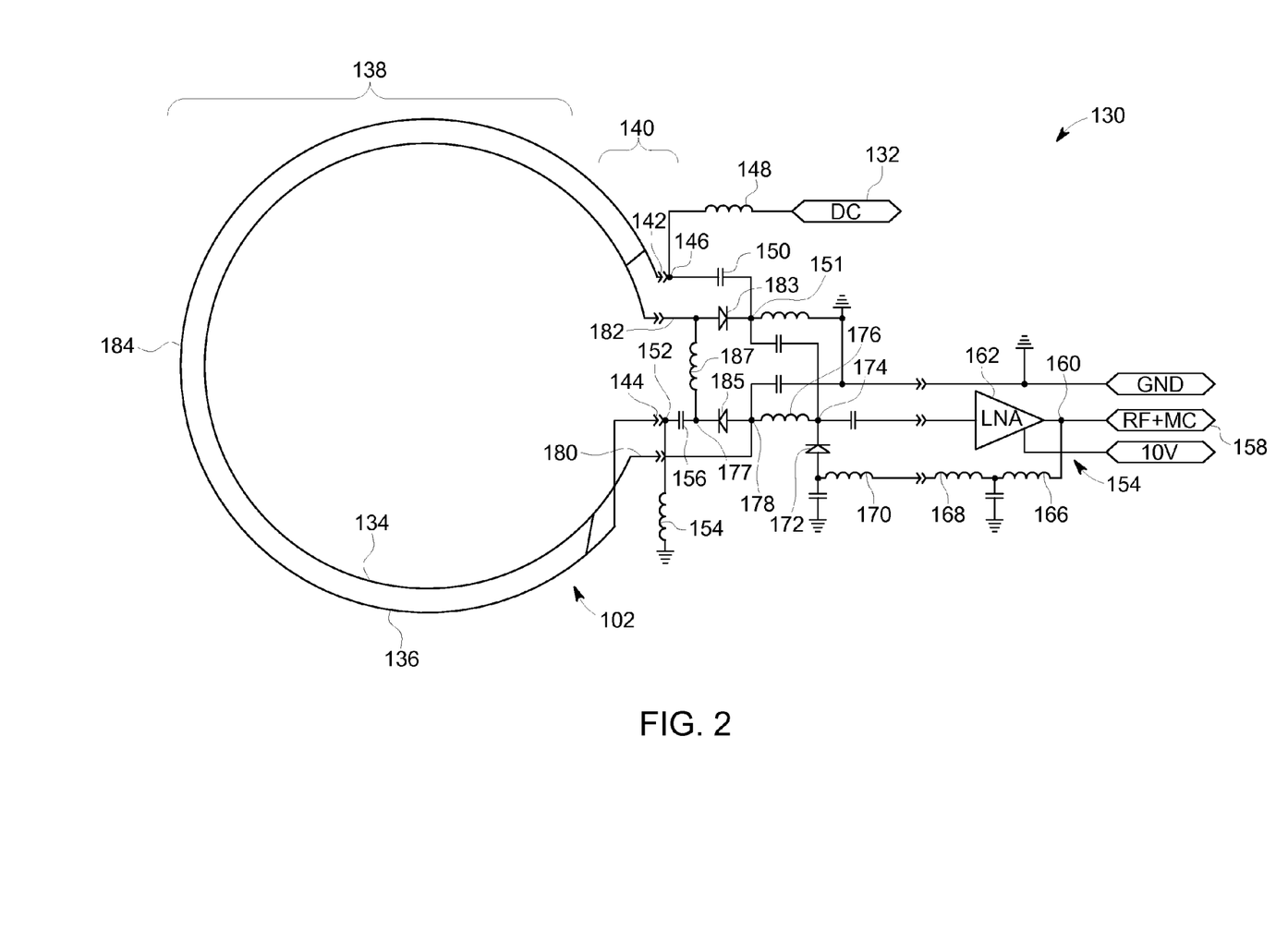
FIG. 2 is a schematic of an RF coil and a controller circuit formed in accordance with an embodiment.

FIG. 2 is a schematic of the RF coil 102 and a controller circuit 130 formed in accordance with an embodiment. The controller circuits 130 allows the RF coil 102 to transmit and receive RF signals when driven by the transceiver system 124 (shown in FIG. 1), and simultaneously operate as a shimming RF coil to produce the gradient magnetic field $B_{shim}$ when driven by the gradient field controller 120 (shown in FIG. 1). The gradient field controller 120 may include a DC power source 132 that provides the shim current. The shimming RF coil 102 includes a first conductor 134 and a second conductor 136. In the illustrated embodiment, the first conductor 134 is configured as a shimming RF coil 134; however, in other embodiments, one, or both of the conductors 134, 136 may be configured as shimming RF coils. At least one of the first and second conductors 134, 136 are elongated and continuous to provide a conducive path to convey the select DC current form the DC source through the shimming RF coil 134. The shimming RF coil 134 generates the gradient magnetic field $B_{shim}$. For example, the DC power source 132 may supply two or more ampere of shimming current to and through the shimming RF coil 134 to generate the gradient magnetic field $B_{shim}$. The shimming RF coil 134 may be made of any electrical conductor selectively sized (e.g., having a select wire diameter or wire gauge) to carry the shim current.

In the illustrated embodiment, the first and second conductors 134, 136 are shaped into a loop portion 138 that terminates to an interface 140. But in other embodiments, other shapes are possible. For example, the loop portion 132 may be a polygon, shaped to conform the contours of a surface (e.g., housing), and/or the like. The loop portion 138 defines a conductive pathway along the first and second conductors 134, 136. The first and second conductors 134, 136 are void of any discrete or lumped capacitive or inductive elements along an entire length of the conductive pathway. The first and second conductors 134, 136 are uninterrupted and continuous along an entire length of the loop portion 138. The loop portion 138 may also include one or more loops or turns to vary the length of the first and second conductors 134, 136. Accordingly, the strength of the gradient magnetic field $B_{shim}$ may be varied based on the number of turns. For example, the loop portion 138 may include 1 turn, 2 turns, 5 turns, 10 turns, or more, and the like.

The first and second conductors 134, 136 have a distributed capacitance along the length of the loop portion 138 (e.g., along the length of the first and second conductors 134, 136). The first and second conductors 134, 136 exhibit a substantially equal and uniform capacitance along the entire length of the loop portion 138. Distributed capacitance (DCAP), as used herein, represents a capacitance exhibited between conductors that grows evenly and uniformly along the length of the conductors and is void of discrete or lumped capacitive elements and discrete or lumped inductive elements. In the examples herein, the capacitance grows in a uniform manner along the length of the first and second conductors 134, 136. At least one of the first and second conductors 134, 136 are elongated and continuous. In the illustrated embodiment, both the first and second conductors 134, 136 are elongated and continuous. But in other embodiments, only one of the first or second conductors 134, 136 may be elongated and continuous. The first and second conductors 134, 136 form continuous distributed capacitors. As such, at least one of the first or second conductors 134, 136 are elongated and continuous such that the first or second conductor conveys the shimming DC current about an entire length thereof. The rate of change of capacitance grows at a substantially constant rate of change along the length of the conductors 134, 136. In the illustrated embodiment, the first conductor 134 of the shimming RF coil 136 forms an elongated continuous conductor that exhibits DCAP along the length of the first conductor 134. The first conductor 134 is void of any discrete capacitive and inductive elements along the entire length of the continuous conductor between terminating ends of the first conductor 134. For example, the first conductor 134 does not include any discrete capacitors, nor any inductors along the length of the loop portion 138.

A dielectric material 184 separates the first and second conductors 134, 136. The dielectric material 184 may be selectively chosen to achieve a select distributive capacitance. The dielectric material 184 may be based on a desired permittivity $\in$ to vary the effective capacitance of the loop portion 138. For example, the dielectric material 184 may be air, rubber, plastic, and/or the like. For example, the dielectric material 184 may be a rubber insulator surrounding the conductive elements of the first and second conductors 134, 136. The first and second conductors 134, 136 may be twisted upon one another to from a twisted pair cable. As another example, the dielectric material 184 may be a plastic material. The first and second conductors 134, 136 may form a coaxial cable in which the plastic dielectric material 184 separates the first and second conductors 134, 136. As another example, the first and second conductors 134, 136 may be configured as a microstrip.

The shim coil 134 includes a first terminating end 142 and a second terminating end 144 that terminates at the interface 140. The first terminating end 142 is coupled to the controller circuit 130 at a junction 146. The first terminating end 142 may also be referred to herein as a "drive end." An isolation inductor 148 is in series with the DC power source 132 and is coupled to the first terminating end 142 at the junction 146. The isolation inductor 148 is not in the coil or is "off" the coil. The isolation inductor 148 allows shimming DC current to pass therethrough, while impeding alternating current (AC) signals. An isolation capacitor 150 is positioned upstream of the junction 146. The isolation capacitor 150, in connection with a shimming operation, blocks the shimming DC current from flowing into the RF blocking DC controls toward node 151. The second terminating end 144 is coupled to the controller circuit 130 at a junction 152. The second terminating end 144 is also referred to herein as a "second drive end." An isolation inductor 154 serially connects the junction 152 to electrical ground. An isolation capacitor 156 is positioned upstream of the junction 152. The isolation capacitor 156, in connection with a shimming operation, blocks the shimming DC current from flowing into the RF blocking DC controls toward a node 177. In this manner, the DC power supply 132 supplies a shim current to and through the controller circuit 130, and the shim coil 134, to generate the gradient magnetic field $B_{shim}$ without interfering with the transceiver system 124 (shown in FIG. 1).

The controller circuit 130 is operably and communicatively coupled to the transceiver system 124 to allow the RF coil 102 to transmit and receive RF signals. In the illustrated embodiment, the controller circuit 130 includes a signal interface 158 configured to transmit and receive the RF signals from the transceiver system 124. The controller circuit 130 includes a junction 160 in serial between the output node of an amplifier 162 and the signal interface 158. A transmit branch 154 extends from the junction 160. The transmit branch 154 includes isolating inductors 166, 168, and 170, and a blocker diode 172 connected to one another in series along the transmit branch 154. The blocker diode 172 limits the direction of current flow to block RF receive signals from proceeding into the transmit branch 154. The transmit branch 154 includes a junction 174 in serial with, and downstream of, the blocker diode 172. An isolation inductor 176 is in serial between the junction 174 and a junction 178. A first terminating end 180 of the second conductor 134 terminates to the junction 178. The second conductor 134 extends around the loop portion 138 and terminates at a second terminating end 182 at the interface 140. Isolation diodes 183, 185 provide RF decoupling during transmit operations. A DC isolation inductor 187 is connected in parallel with the second conductor 134 and is configured to divert DC current flow therethrough.

In operation, the controller circuit 130 changes the resonance frequency of the RF coil 102 to switch between transmit and receive mode. The first and second conductors 134, 136 have capacitive and inductive properties that produce an effective LC circuit resonant at a select center frequency. For example, RF coil 102 may be selectively dimensioned (e.g., sized and shaped), to have a center frequency of 128 Mhz. The resonance frequency of the RF coil 102 is based on the inductance and capacitance exhibited by the first and second conductors 134, 136. The first and second conductors 134, 136 may exhibit a select inductance and a select distributed capacitance that substantially equal one another. The first and the second conductors 134, 136 may have predetermined lengths such that the first and second conductors exhibit a desired integrated distributed capacitance and inductance. For example, the lengths of the first and second segments 134, 136 may be varied to achieve a resonance frequency of 128 Mhz. Accordingly, when transmitting, current flows through the shunt diodes 183, 185 to change the capacitance of the RF coil 102 and the resonance frequency to detune the RF coil 102 away from the center frequency.

Figure 3:
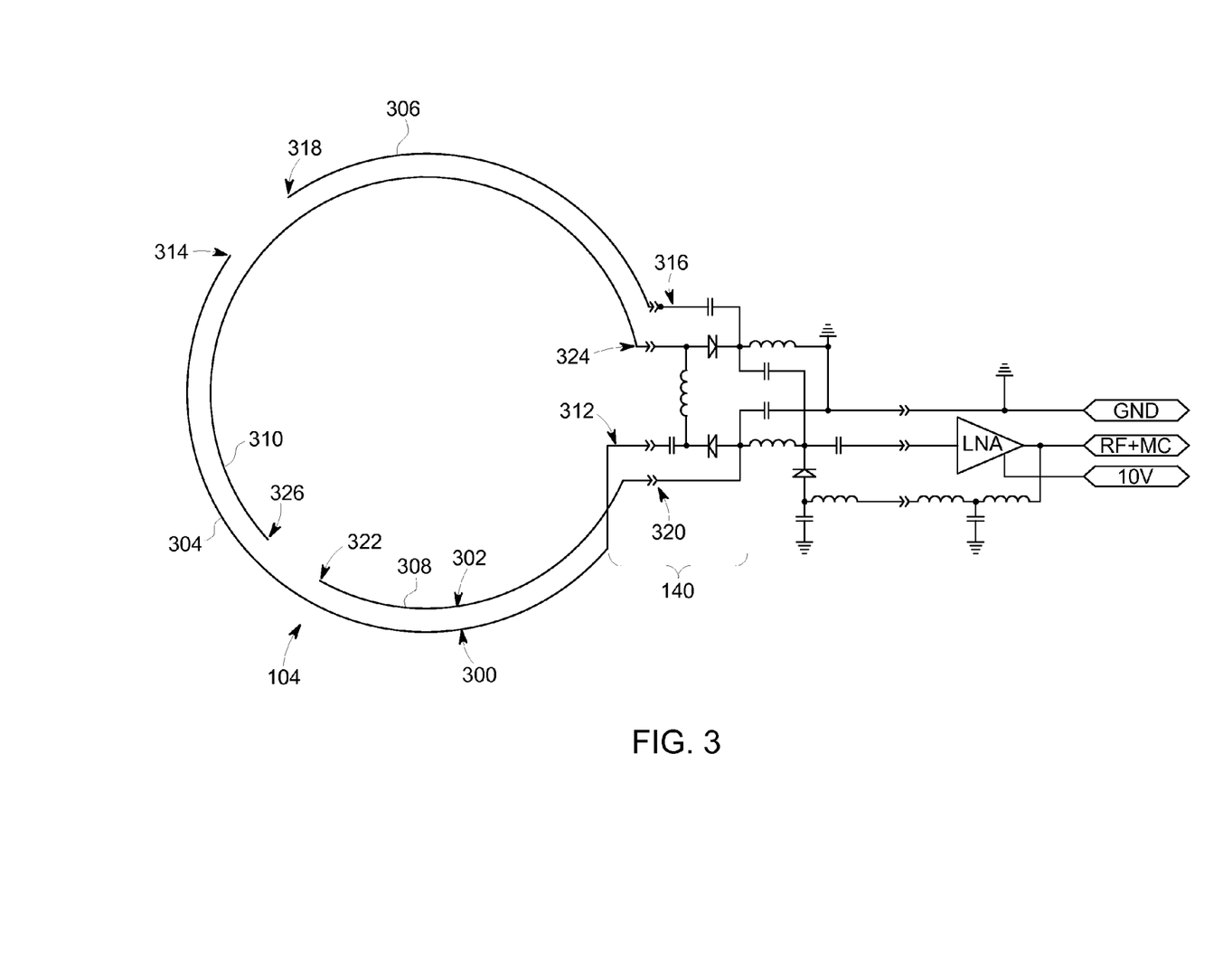
FIG. 3 is a schematic of an RF coil having segmented conductors formed in accordance with an embodiment.

FIG. 3 is a schematic of the RF coil 104 having segmented conductors formed in accordance with an embodiment. In the illustrated embodiment, the RF coil 104 includes a first conductor 300 and a second conductor 302. The first and second conductors 300, 302 may be segmented such that the conductors form an open circuit (e.g., form a monopole). The segments of the conductors 300, 302 may have different lengths, as is discussed below. The length of the first and second conductors 300, 302 may be varied to achieve a select distributed capacitance, and accordingly, a select resonance frequency.

The first conductor 300 includes a first segment 304 and a second segment 306. The first segment 304 includes a driven end 312 at the interface 140 terminating to the controller circuit 130. The first segment 304 also includes a floating end 314 that is detached from a reference ground, thereby maintaining a floating state. The second segment 306 includes a driven end 316 at the interface 140 terminating to the controller circuit 130 and a floating end 318 that is detached from a reference ground.

The second conductor 302 includes a first segment 308 and a second segment 310. The first segment 308 includes a driven end 320 at the interface 140 terminating to the controller circuit 130. The first segment 308 also includes a floating end 322 that is detached from a reference ground, thereby maintaining a floating state. The second segment 310 includes a driven end 324 at the interface 140 terminating to the controller circuit 130, and a floating end 326 that is detached from a reference ground. As an RF coil having the segmented conductors, the driven ends 312, 316, 320, and 324 are detached from the DC power source 132. As such, embodiments having an RF coil with segmented conductors may not be configured as shim coils.

The first conductor 300 exhibits a distributed capacitance that grows based on the length of the first and second segments 304, 306. The second conductor 302 exhibits a distributed capacitance that grows based on the length of the first and second segments 308, 310. The first segments 304, 308 may have a different length than the second segments 306, 310. The relative difference in length between the first segments 304, 308 and the second segments 306, 310 may be used to produce an effective LC circuit have a resonance frequency at the desired center frequency. For example, by varying the length of the first segments 304, 308 relative to the lengths of the second segments 306, 310, an integrated distributed capacitance may be varied.

Figure 4:
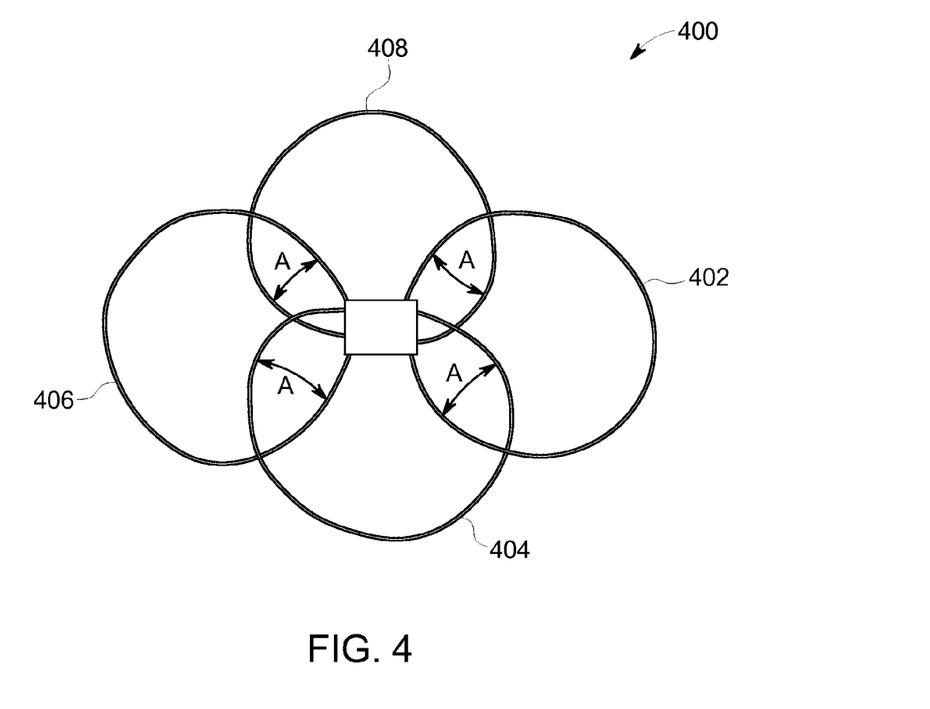
FIG. 4 is a perspective view of an RF coil array having four lobes formed in accordance with an embodiment.
Figure 5:
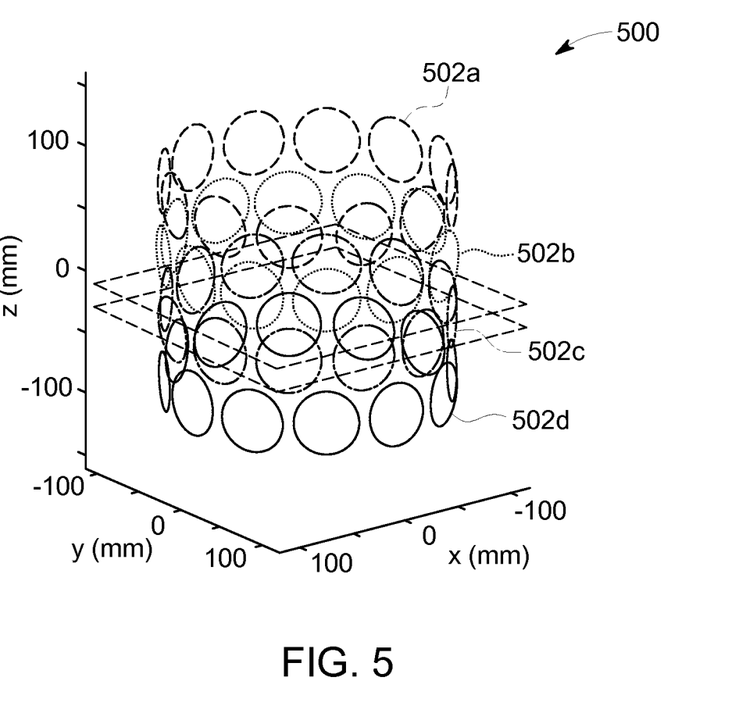
FIG. 5 is a perspective illustration of an RF array network formed in accordance with an embodiment.

FIG. 4 is a perspective view of an RF coil array 400 having four lobes 402, 404, 406, 408 formed in accordance with an embodiment. In accordance with embodiments herein, a plurality of RF coils, such as the RF coils 102, 104 described above, may be coupled to one another to form the RF coil array 400. Each of the RF coils 402-408 may include a plurality of turns. The lobes 402, 404, 406, 408 include regions of overlap A. In the illustrated embodiment, the RF coil array 400 includes four lobes, or RF coils. But in other embodiments, other arrangements are possible. For example, FIG. 5 shows a perspective illustration of an RF array network 500 formed in accordance with an embodiment. In the illustrated embodiment, the RF array network 500 includes four rings 502a, 502b, 502c, and 502d each including a plurality of RF coils. But in other embodiments, the RF array network 500 may include more or fewer rings 202. The ring 502 may be positioned along the length of the bore of the magnet 108 (shown in FIG. 1).

Figure 6:
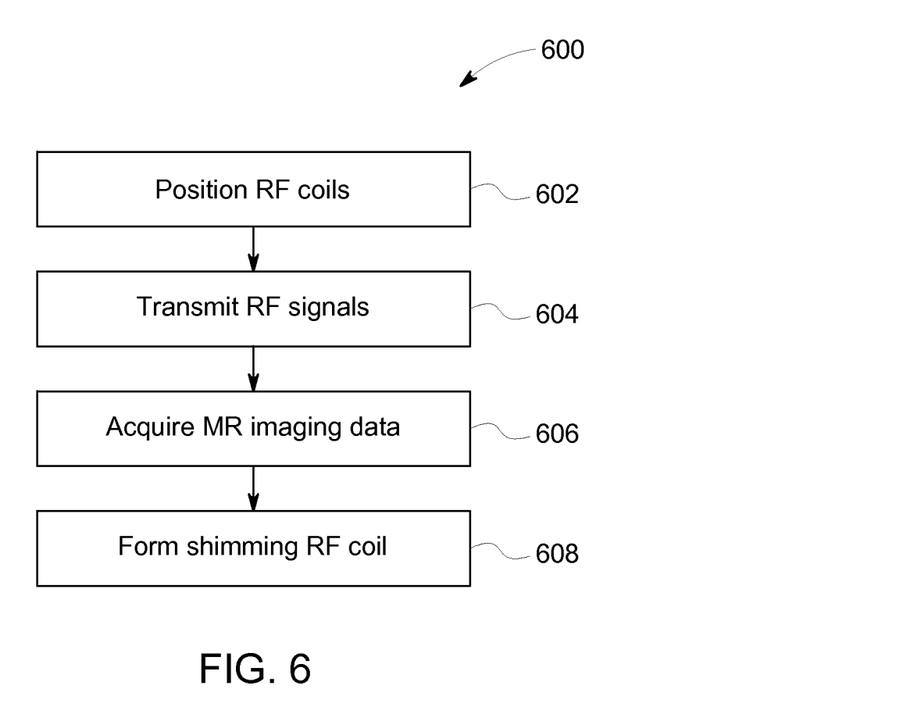
FIG. 6 is a flowchart of a method for generating an MRI image of an object utilizing RF coils formed in accordance with an embodiment.
Figure 7:
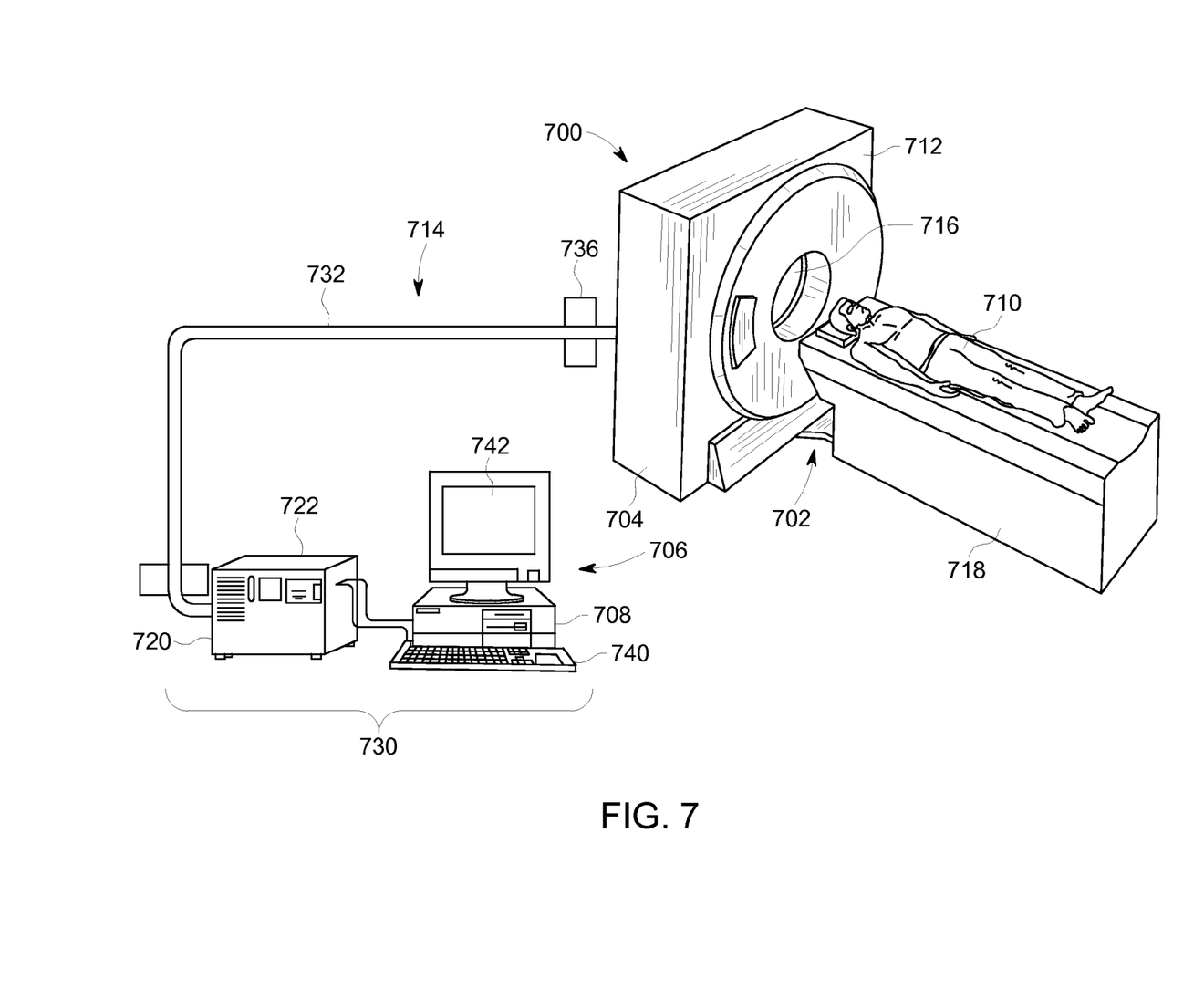
FIG. 7 is a schematic illustration of a medical imaging system in which various embodiments may be implement.

FIG. 6 is a flowchart of an exemplary method 600 for generating an MRI image of an object utilizing RF coils formed in accordance with an embodiment. For example, the imaging system 100 shown in FIG. 1 may be used to form the MRI image. The method 600 may be embodied as a set of instructions that are stored on a computer, for example, as shown in FIG. 7.

At 602, a plurality of radio frequency (RF) coils are positioned about a bore of a magnet. The magnet is configured to produce a static B0 field. The B0 field has non-homogeneous characteristics in an area of interest.

At 604, an RF transceiver system transmits RF signals to the RF coils.

At 606, the RF coils acquire MR imaging data from the RF coils for an object in the area of interest using the RF transceiver system.

At 608, a direct current (DC) source is coupled to at least one of the RF coils to form a shimming RF coil, the DC source is configured to force a select DC current through the shimming RF coil to at least partially shim the non-homogeneous characteristics of the B0 field for the area of interest. The RF shimming coil includes first and second conductors that exhibit distributed capacitance (DCAP) along a length thereof. At least one of the first and second conductors have first and second termination ends with an elongated and continuous conductive path therebetween to convey the select DC current from the DC source through the shimming DC coil. Optionally, at least one of the RF coils includes a float end detached from the DC source and detached from a reference ground, thereby maintaining a floating state. Optionally, the shimming RF coil is void of any capacitive and inductive discrete or lumped elements along an entire length of the continuous conductor between the terminating ends thereof. Optionally, the shimming RF coil operates as an RF coil to transmit and receive RF signals when driven by the RF transceiver system, and the shimming RF coil simultaneously operates as a shimming coil to produce a correction field when driven by the DC source to at least partially correct the non-homogeneous characteristics. Optionally, the shimming RF coil exhibits substantially equal and uniform capacitance along an entire length of the shimming RF coil. Optionally, the first conductor and the second conductor exhibit a select inductance and a select distributed capacitance that substantially equals one another. Optionally, the first and second conductors may differ in length. Optionally, the first conductor or the second conductor have a predetermined length such that an integrated distributed capacitance and inductance formed by the first conductor or the second conductor produces an effective LC circuit resonant at a select center frequency. Optionally, the first conductor and the second conductor exhibit a distributed capacitance that grows based on a lengths of the first and second conductors. Optionally, the first and second conductors may be configured as at least one of a twisted pair cable, a coaxial cable, or a microstrip.

FIG. 7 is a schematic illustration of a medical imaging system in which various embodiments may be implemented. The imaging system 700 includes an imaging portion 702 having an imaging unit 704 (e.g., imaging scanner) and a processing portion 706 that may include a processor 708 or other computing or controller device. One or more functions performed by the controller 118 and/or the pulse module 128 discussed in relation to the discussion of FIG. 1, may be performed by the processor 708. In particular, the imaging unit 704 enables the imaging system 700 to scan an object or patient 710 to acquire image data, which may be image data of all or a portion of the object or patient 710. The imaging unit 704 includes a gantry 712 having one or more imaging components (e.g., magnets or magnet windings within the gantry 712) that allow acquisition of the image data. In multi-modality imaging systems, in addition to the magnet(s) for magnetic resonance imaging, an x-ray source and detector for computed-tomography imaging, or gamma cameras for nuclear medicine imaging may be provided. The imaging components produce signals that represent image data that is communicated to the processing portion 706 via a communication link 714 that may be wired or wireless. During an imaging scan by the imaging unit 704, the gantry 712 and the imaging components mounted thereon or therein may remain stationary or rotate about or along a center of rotation defining an examination axis through a bore 716. The patient 710 may be positioned within the gantry 712 using, for example, a motorized table 718.

In operation, an output of one or more of the imaging components is transmitted to the processing portion 706, and vice versa, which may include transmitting signals to or from the processor 708. The processor 708 also may generate control signals for controlling the position of the motorized table 718 or imaging components based on user inputs or a predetermined scan. For example, RF signals or transmit pulses may be communicated through the communication link 714, which in one embodiment is embodied as the coaxial cable 732. It should be noted that the communication link 714 may also include the coaxial cable 734 or a separate communication link may be provided.

During a scan, image data, such as magnetic resonance image data from the imaging components may be communicated to the processor 708 through a data interface 722 via the control interface 720, for example, as acquired by a body coil or surface coil.

The processor 708 and associated hardware and software used to acquire and process data may be collectively referred to as a workstation 730. The workstation 730 includes a keyboard 740 and/or other input devices such as a mouse, a pointer, and the like, and a monitor 742. The monitor 742 displays image data and may accept input from a user if a touchscreen is available.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid-state drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), ASICs, logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f) unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A magnetic resonance imaging (MRI) system comprising:
a plurality of radio frequency (RF) coils positioned about a bore of a magnet, the magnet configured to produce a static B0 field, the B0 field having non-homogeneous characteristics in an area of interest;
an RF transceiver system configured to transmit RF signals to the RF coils and configured to acquire MR imaging data from the RF coils for an object in the area of interest; and
a direct current (DC) source coupled to at least one of the RF coils to form a shimming RF coil, the DC source configured to force a select DC current through the shimming RF coil to at least partially shim the non-homogeneous characteristics of the B0 field for the area of interest,
wherein the shimming RF coil includes first and second conductors that exhibit distributed capacitance (DCAP) along a length thereof, at least one of the first and second conductors having first and second termination ends with an elongated and continuous conductive path therebetween to convey the select DC current from the DC source through the shimming RF coil, wherein the shimming RF coil is void of discrete capacitive elements and discrete inductive elements along the continuous conductive path between the first and second termination ends.

2. The system of claim 1, wherein at least one of the RF coils includes a float end detached from the DC source and detached from a reference ground, thereby maintaining a floating state.

3. The system of claim 1, wherein the first termination end is coupled to a controller circuit and the direct current source via a first junction, and the second termination end is coupled to the controller circuit via a second junction, the system comprising an isolation capacitor configured to block the DC current, the isolation capacitor disposed off of the shimming RF coil and interposed between the second junction and the RF transceiver system.

4. The system of claim 1, wherein the shimming RF coil operates as an RF coil to transmit and receive RF signals when driven by the RF transceiver system, and the shimming RF coil simultaneously operates as a shimming coil to produce a correction field when driven by the DC source to at least partially correct the non-homogeneous characteristics.

5. The system of claim 1, wherein the shimming RF coil exhibits substantially equal and uniform capacitance along an entire length of the shimming RF coil.

6. The system of claim 1, wherein the shimming RF coil has a center frequency of 128 Mhz.

7. The system of claim 1, wherein the first and second conductors differ in length.

8. The system of claim 1, wherein the at least one of the first conductor or the second conductor has a predetermined length such that an integrated distributed capacitance and inductances formed by the first conductor or the second conductor produces an effective LC circuit resonant at a select center frequency.

9. The system of claim 1, wherein the first conductor and the second conductor exhibit a distributed capacitance that grows based on lengths of the first and second conductors.

10. The system of claim 1, wherein the first and second conductors are configured as at least one of a twisted pair cable, a coaxial cable, or a microstrip.

11. A method of generating a magnetic resonance (MR) image comprising:
positioning a plurality of radio frequency (RF) coils about a bore of a magnet, the magnet configured to produce a static B0 field, the B0 field having non-homogeneous characteristics in an area of interest;
transmitting RF signals to the RF coils using an RF transceiver system;

acquiring MR imaging data from the RF coils for an object in the area of interest using the RF transceiver system;

coupling a direct current (DC) source to at least one of the RF coils to form a shimming RF coil, the DC source configured to force a select DC current through the shimming RF coil to at least partially shim the non-homogeneous characteristics of the B0 field for the area of interest, wherein the shimming RF coil includes first and second conductors that exhibit distributed capacitance (DCAP) along a length thereof, at least one of the first and second conductors having first and second termination ends with an elongated and continuous conductive path therebetween to convey the select DC current driven from the DC source through the shimming RF coil, wherein the shimming RF coil is void of discrete capacitive elements and discrete inductive elements along the continuous conductive path between the first and second termination ends.

12. The method of claim 11, wherein at least one of the RF coils includes a float end detached from the DC source and detached from a reference ground, thereby maintaining a floating state.

13. The method of claim 11, wherein the first termination end is coupled to a controlling circuit and the direct current source at a first junction, and the second termination end is coupled to the controlling circuit at a second junction, the system comprising an isolation capacitor configured to block the DC current, the isolation capacitor disposed off of the shimming RF coil and interposed between the second junction and the RF transceiver system.

14. The method of claim 11, wherein the shimming RF coil operates as an RF coil to transmit and receive RF signals when driven by the RF transceiver system, and the shimming RF coil simultaneously operates as a shimming coil to produce a correction field when driven by the DC source to at least partially correct the non-homogeneous characteristics.

15. The method of claim 11, wherein the shimming RF coil exhibits substantially equal and uniform capacitance along an entire length of the shimming RF coil.

16. The method of claim 11, wherein the shimming RF coil has a center frequency of 128 Mhz.

17. The method of claim 11, wherein the first and second conductors differ in length.

18. The method of claim 11, wherein the first conductor has a predetermined length such that an integrated distributed capacitance and inductances formed by the first conductor produces an effective LC circuit resonant at a select center frequency.

19. The method of claim 11, wherein the first conductor and the second conductor exhibit a distributed capacitance that grows based on lengths of the first and second conductors.

20. The method of claim 11, wherein the first and second conductors are configured as at least one of a twisted pair cable, a coaxial cable or a microstrip.

* * * * *